US011985792B2

United States Patent
Ikeda et al.

(10) Patent No.: US 11,985,792 B2
(45) Date of Patent: May 14, 2024

(54) ELECTRONIC COMPUTING APPARATUS AND ENCLOSURE THEREFOR

(71) Applicant: Hitachi, Ltd., Tokyo (JP)

(72) Inventors: Sho Ikeda, Tokyo (JP); Osamu Kamimura, Tokyo (JP); Kenichi Miyamoto, Tokyo (JP); Akihiro Adachi, Kanagawa (JP)

(73) Assignee: HITACHI, LTD., Tokyo (JP)

( * ) Notice: Subject to any disclaimer, the term of this patent is extended or adjusted under 35 U.S.C. 154(b) by 183 days.

(21) Appl. No.: 17/688,026

(22) Filed: Mar. 7, 2022

(65) Prior Publication Data

US 2023/0171913 A1 Jun. 1, 2023

(30) Foreign Application Priority Data

Nov. 26, 2021 (JP) .................................. 2021-191739

(51) Int. Cl.
*H05K 7/20* (2006.01)
*G06F 1/20* (2006.01)
*H05K 7/18* (2006.01)

(52) U.S. Cl.
CPC .......... *H05K 7/20145* (2013.01); *G06F 1/20* (2013.01); *H05K 7/18* (2013.01)

(58) Field of Classification Search
CPC .. H05K 7/20145; H05K 7/18; H05K 7/20727; H05K 7/20172; G06F 1/20
See application file for complete search history.

(56) References Cited

U.S. PATENT DOCUMENTS

| 5,168,424 | A | * | 12/1992 | Bolton | G11B 33/128 |
| 7,593,225 | B2 | * | 9/2009 | Sasagawa | G06F 1/20 |
| | | | | | 165/122 |
| 8,305,756 | B2 | * | 11/2012 | Regimbal | H05K 7/2019 |
| | | | | | 361/695 |
| 9,710,028 | B2 | * | 7/2017 | Petruzzo | G06F 1/20 |
| 11,513,571 | B2 | * | 11/2022 | Pan | H05K 7/20145 |
| 11,675,397 | B2 | * | 6/2023 | Eiland | G06F 1/20 |
| | | | | | 312/223.2 |
| 2002/0054479 | A1 | * | 5/2002 | Wu | H05K 7/20727 |
| | | | | | 361/695 |
| 2006/0039108 | A1 | * | 2/2006 | Chikusa | G06F 1/20 |
| 2012/0113582 | A1 | * | 5/2012 | Hirano | G06F 1/20 |
| | | | | | 312/319.1 |
| 2013/0139000 | A1 | * | 5/2013 | Nakamura | G11B 33/142 |
| | | | | | 714/14 |

(Continued)

FOREIGN PATENT DOCUMENTS

JP 2010-170181 A 8/2010

*Primary Examiner* — Stephen S Sul
(74) *Attorney, Agent, or Firm* — Volpe Koenig

(57) ABSTRACT

An enclosure of an electronic computing apparatus allows two electronic computing modules, each having a built-in fan, to be mounted in a perpendicular direction, when the two electronic computing modules are inserted, a shutter is at an intermediate position due to an elastic force of pushing a spring cover in a front surface direction, from push rods corresponding to the two electronic computing modules, and when one of the electronic computing modules is removed, the elastic force of pushing the cover from the push rod on the removal is lost, and the shutter moves, around a rotating mechanism, to a side of a housing space on the removal side and shuts off a flow path in the housing space.

11 Claims, 9 Drawing Sheets

(56) References Cited

U.S. PATENT DOCUMENTS

| | | | |
|---|---|---|---|
| 2013/0250507 A1* | 9/2013 | Ito | G06F 1/16 361/679.32 |
| 2014/0092541 A1* | 4/2014 | Zhang | G06F 1/20 361/679.5 |
| 2021/0352822 A1* | 11/2021 | Zheng | H05K 7/20163 |
| 2022/0071051 A1* | 3/2022 | Chang | H05K 7/20145 |

* cited by examiner

ELECTRONIC COMPUTING APPARATUS AND ENCLOSURE THEREFOR

BACKGROUND OF THE INVENTION

Field of the Invention

The present invention relates to an electronic computing apparatus and an enclosure therefor, and is suitably applied to an electronic computing apparatus where electronic computing modules, each with a built-in cooling fan, are mounted on upper and lower tiers, and an enclosure therefor.

Description of the Related Art

Conventionally, with respect to an electronic computing apparatus (such as a storage unit) where a plurality of heat sources (such as drives) are mounted inside an enclosure, importance of cooling the heat sources to prevent reduction in performance caused by heat is well known.

For example, a first embodiment of Japanese Patent Laid-Open No. 2010-170181 discloses a structure of a computer, where a plate-shaped member that turns according to a wind pressure balance between two cooling fans is used as a check valve for blocking, when one of the cooling fans stops, a ventilation path of the cooling fan. Furthermore, a second embodiment of Japanese Patent Laid-Open No. 2010-170181 discloses a structure for electrically controlling operation of the plate-shaped member described above.

As a structure of a general storage unit where a plurality of drives are mounted, there is known a structure where the plurality of drives are disposed on one side (for example, a front surface side) of an enclosure that is open at a front and a back, and where controller boards (electronic computing modules), each with a built-in cooling fan, are disposed on the other side (for example, a rear surface side) while being mounted separately on upper and lower tiers. With a storage unit having such a structure, by reserving a ventilation path for the drives and for the controller boards, even when the controller boards are mounted on the upper and lower tiers, cooling air is taken in from outside and is caused to pass through the enclosure by operation of the cooling fans, and heat sources (such as the drives) may be cooled.

However, with a conventional storage unit having the structure as described above, when one controller board is removed at the time of maintenance or the like, a space after removal is left as a hollow space inside the enclosure, and circulation is caused due to a drastic reduction in pressure loss. When circulation occurs, the amount of air that is taken in from the drive side is reduced, and there is a problem that cooling performance for the drives is reduced.

In relation to the problem of occurrence of such circulation, a solution is known according to which an unnecessary ventilation path (a flow path for cooling air) is blocked by using a movable shutter, but in this case, as many shutters (that is, two shutters) have to be installed as the number of controller boards that are mounted. However, when the shutter is installed on each of tiers that are vertically next to each other, other problems are caused, such as restrictions on a size of the enclosure and on a housing space inside the enclosure. Because there are restrictions on the enclosure of the storage unit due to an orientation of the controller board and component heights, an increase in the size of the enclosure or a reduction in the housing space inside the enclosure is not desirable.

Furthermore, Japanese Patent Laid-Open No. 2010-170181 described above discloses a cooling structure according to which the ventilation paths are switched by one plate-shaped member, but application thereof to a storage unit where controller boards are mounted on two tiers that are vertically next to each other is considered difficult because of a big difference in the structures of electronic computing apparatuses where the cooling structure is to be mounted. Furthermore, in the case where operation of the shutter is electrically controlled, as in the case of the structure disclosed in the second embodiment of Japanese Patent Laid-Open No. 2010-170181, a sensor for monitoring operation of the cooling fan, an actuator for controlling the plate-shaped member, and the like become necessary, and thus, there are problems such as an increase in component costs and restrictions on the housing space.

The present invention has been made in view of the above, and proposes an electronic computing apparatus and an enclosure therefor, with which occurrence of circulation inside the enclosure of the electronic computing apparatus where an electronic computing module may be mounted on each of two tiers that are vertically next to each other can be prevented, at a time of removal of the electronic computing module from one of the tiers, by a minimum number of shutters (that is, one shutter) and without needing electrical control.

SUMMARY OF THE INVENTION

To solve the problems as described above, the present invention provides an enclosure for an electronic computing apparatus that allows mounting of a storage apparatus and two electronic computing modules, the electronic computing modules each having a built-in fan and being disposed on a rear surface side of the storage apparatus in a perpendicular direction relative to a bottom surface of the enclosure, the enclosure including:

a partition plate that separates housing spaces for mounting the two electronic computing modules;

one shutter that is a plate-shaped member for adjusting a flow path, in the housing spaces, of cooling air generated by operation of the fan, the shutter being disposed extending from the partition plate, on the rear surface side of the storage apparatus;

at least one rotating mechanism that couples the partition plate and the shutter, and that is rotatable around a rotation shaft of the rotating mechanism;

a push rod that is a bar-shaped member disposed between a cover fixed to the shutter and each electronic computing module, the push rod being moved, at a time of insertion of a corresponding electronic computing module of the electronic computing modules, in an insertion direction by being pushed by the corresponding electronic computing module to come into contact with the cover; and a push rod spring that is an elastic member wound around the push rod, the push rod spring applying an elastic force of pushing in a front surface direction to the push rod by being compressed by movement of the push rod in the insertion direction, wherein in a case where the two electronic computing modules are inserted in the housing spaces, the shutter is at an intermediate position between the two electronic computing modules due to an elastic force of pushing the cover in the front surface direction from the push rod corresponding to each of the two electronic computing modules, and in a case where one of the electronic computing modules is removed from the housing space, the elastic force of pushing the cover in the front surface direction from the push rod corresponding to the removed electronic computing module is lost, and the shutter then moves, around the rotating mechanism, to a side of the housing space for the removed electronic computing module and shuts off the flow path in the housing space.

Furthermore, to solve the problems as described above, the present invention provides an electronic computing apparatus including:

a storage apparatus;

two electronic computing modules each having a built-in fan; and an enclosure, the enclosure housing the storage apparatus on a front surface side, the enclosure housing the two electronic computing modules on a rear surface side of the storage apparatus in a perpendicular direction relative to a bottom surface of the enclosure, wherein the enclosure includes a partition plate that separates housing spaces for mounting the two electronic computing modules, one shutter that is a plate-shaped member for adjusting a flow path, in the housing spaces, of cooling air generated by operation of the fan, the shutter being disposed extending from the partition plate, on the rear surface side of the storage apparatus, and at least one rotating mechanism that couples the partition plate and the shutter, and that is rotatable around a rotation shaft of the rotating mechanism, the two electronic computing modules each include a push rod that is a bar-shaped member disposed on a front surface side of each electronic computing modules, the push rod being moved, at a time of insertion of a corresponding electronic computing module of the electronic computing modules, in an insertion direction by being pushed by the corresponding electronic computing module to come into contact with a cover fixed to the shutter, and a push rod spring that is an elastic member wound around the push rod, the push rod spring applying an elastic force of pushing in a front surface direction to the push rod by being compressed by movement of the push rod in the insertion direction, in a case where the two electronic computing modules are inserted in the housing spaces, the shutter is at an intermediate position between the two electronic computing modules due to an elastic force of pushing the cover in the front surface direction from the push rod corresponding to each of the two electronic computing modules, and in a case where one of the electronic computing modules is removed from the housing space, the elastic force of pushing the cover in the front surface direction from the push rod corresponding to the removed electronic computing module is lost, and the shutter then moves, around the rotating mechanism, to a side of the housing space for the removed electronic computing module and shuts off the flow path in the housing space.

According to the present invention, in a case where the electronic computing module is removed from one tier in the electronic computing apparatus where the electronic computing module may be mounted on each of two tiers that are vertically next to each other, occurrence of circulation inside the enclosure can be prevented by one shutter that does not need to be electrically controlled.

DETAILED DESCRIPTION OF THE PREFERRED EMBODIMENT

Hereinafter, an embodiment of the present invention will be described in detail with reference to the drawings.

Additionally, the following description and the drawings are merely an example for describing the present invention, and are omitted or simplified as appropriate for the sake of clarity. Furthermore, not all the combinations of features described in the embodiment are essential for solving the problems of the invention. The present invention is not limited to the embodiment, and any example application matching the idea of the present invention is included within the technical scope of the present invention. Various additions and modifications may be made in the present invention by those skilled in the art within the scope of the present invention. The present invention may be implemented in various other modes. The number of pieces of each structural element may be plural or singular unless explicitly limited.

Additionally, in the following description, when giving a description of elements of a same type without distinguishing between the elements, a common part of a reference sign including an additional character or a branch number (the common part being a part excluding the additional character or the branch number) may be used, and when giving a description while distinguishing between elements of a same type, a reference sign including the additional character or the branch number may be used. For example, in the case of giving a description of push rods while not distinguishing each one, a term "push rod(s) 43" will be used, but in the case of giving a description while distinguishing each push rod 43, terms "push rod 43*a*", "push rod 43*b*" and the like will be used.

Figure 1:
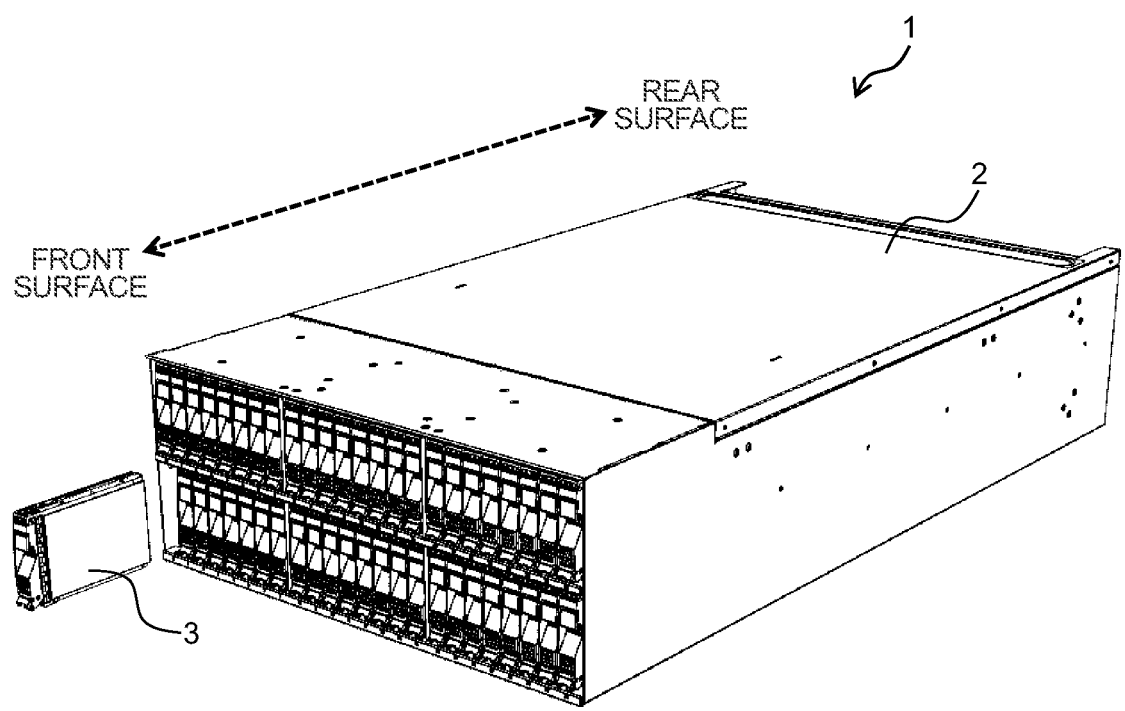
FIG. 1 is a perspective view of an external appearance of a storage unit 1 including a storage enclosure 2 according to an embodiment of the present invention.

FIG. 1 is a perspective view of an external appearance of a storage unit 1 including a storage enclosure 2 according to an embodiment of the present invention. Furthermore, FIG.

2 is a diagram showing an internal structure of the storage enclosure 2. A structure of the storage unit 1 and a structure of the storage enclosure 2 will be described with reference to FIGS. 1, 2 and the like.

The storage unit 1 is an electronic computing apparatus including one or more storage apparatuses (drives 3) and a maximum of two controller boards (electronic computing modules 4) that are disposed in the storage enclosure 2. In the following description, the storage enclosure 2 may sometimes be referred to as "enclosure 2" for the sake of simplicity.

The storage enclosure 2 is a box-shaped structure that functions as an enclosure (a chassis) of the storage unit 1, and is structured to allow a plurality of drives 3 to be mounted from a front side (an enclosure front surface), and to allow the maximum two electronic computing modules 4 to be inserted/removed from a rear side (an enclosure rear surface). The electronic computing modules 4 are disposed separately inside the enclosure 2, on two tiers that are vertically next to each other. In the following, the electronic computing module 4 may sometimes be referred to as "controller 4" for the sake of simplicity. Furthermore, the electronic computing module 4 that is disposed on an upper tier will be referred to as "upper controller 4a", and the electronic computing module 4 that is disposed on a lower tier will be referred to as "lower controller 4b".

As shown in FIG. 1, the plurality of drives 3 are disposed next to one another and on two tiers that are vertically next to each other, on the front surface side of the storage enclosure 2, for example, but in the present embodiment, the number of the drives 3 and the manner of disposing the same are not particularly limited. The drive 3 is, but not limited to, a non-volatile memory express (NVMe) solid state drive (SSD), for example, and may alternatively be various known storage apparatuses. The storage enclosure 2 is at least partially open in a front-back direction, and an air channel (a flow path for cooling air) is formed in the front-back direction. A flow path for cooling air is also formed inside each of the drives 3 and the controllers 4, in the front-back direction, and when a fan 42 of the controller 4 operates, outside air (cooling air) is taken in from a front surface of the drive 3 to be sent to the controller 4 on the rear side.

Figure 5:
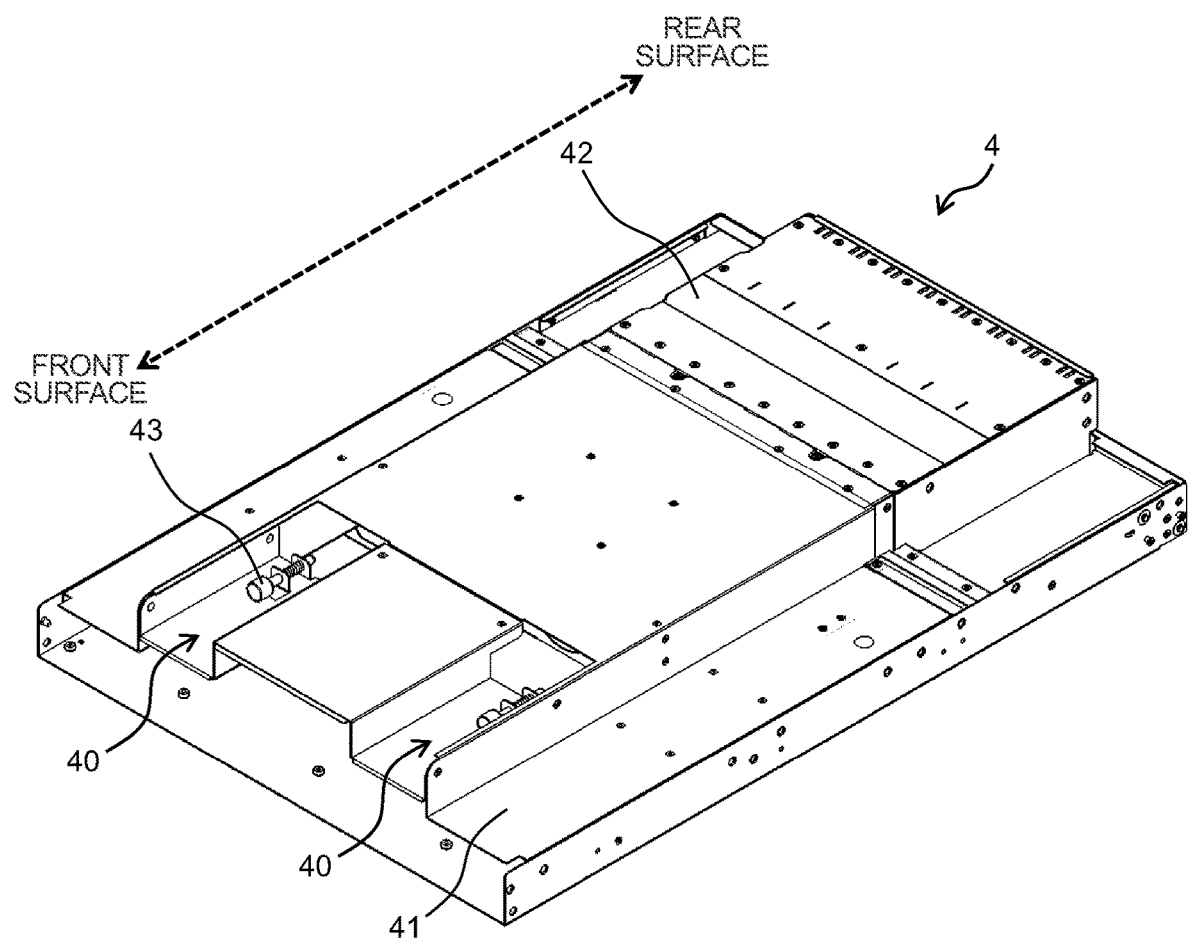
FIG. 5 is a perspective view of an external appearance of a controller 4.

For example, the electronic computing module 4 (the upper controller 4a, the lower controller 4b) is a controller board where a storage controller for controlling a storage system that uses the drive 3 as a physical storage area is mounted, and includes the fan 42 for cooling that is embedded therein (see FIG. 5). The upper controller 4a and the lower controller 4b are inserted into the enclosure 2 while facing each other, and are disposed inside the enclosure 2 in such a position. Additionally, the electronic computing module 4 is not limited to the controller board, and may be any appliance as long as it is an electronic appliance including a fan for cooling.

Additionally, in the present embodiment, the front-back (front surface-rear surface) direction and an up-down direction will be described based on arrangement in FIGS. 1 and 2, but the front-back direction or the up-down direction may be reversed with respect to an actual storage unit 1. For example, inside the enclosure 2, the controller 4 may be inserted/removed from each of the upper tier and the lower tier, and it can be understood that there is no structural difference between the upper tier and the lower tier.

Figure 2:
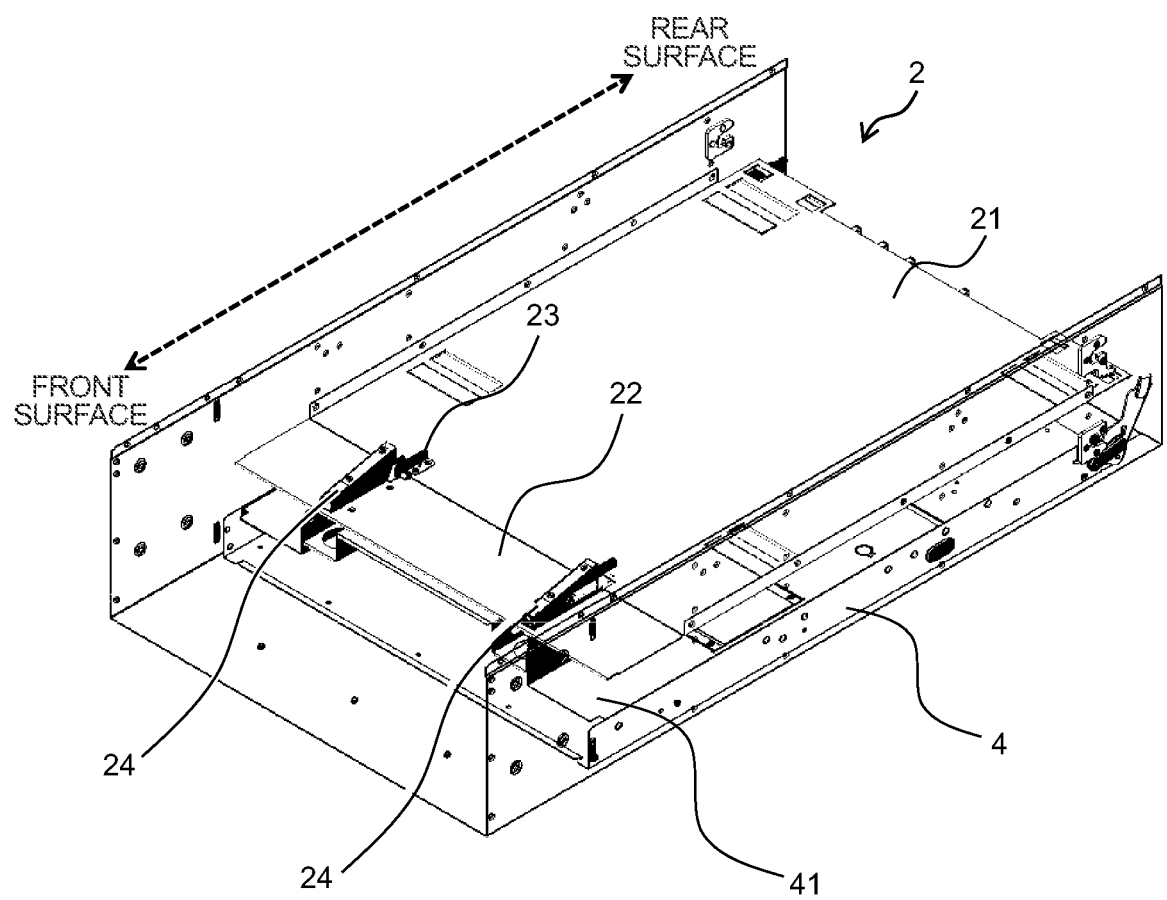
FIG. 2 is a diagram showing an internal structure of the storage enclosure 2.
Figure 3:
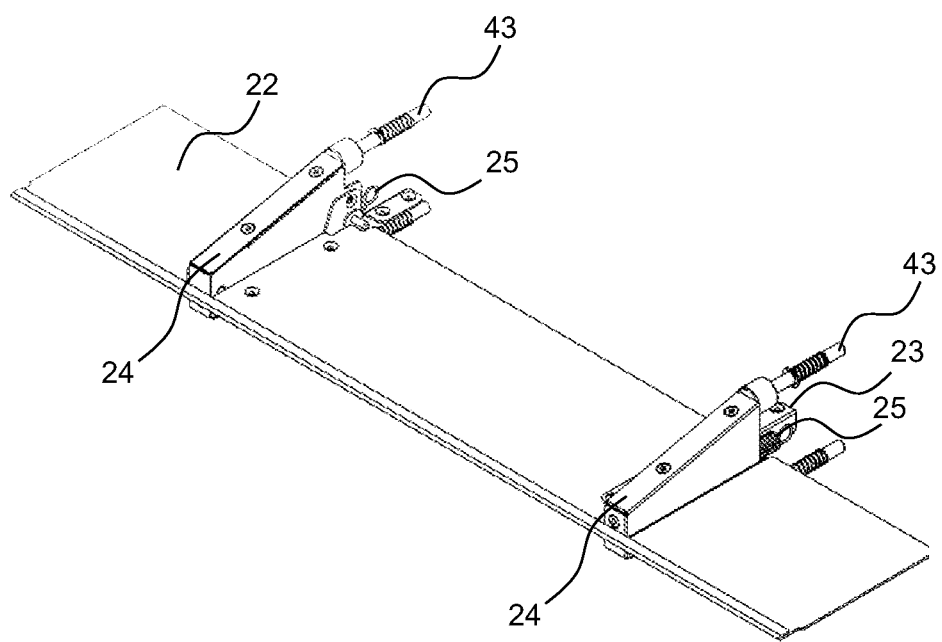
FIG. 3 is a diagram showing a detailed structure of a shutter 22.

As shown in FIG. 2, the enclosure 2 includes a partition plate 21, a shutter 22, a rotating mechanism 23, a spring cover 24, and a shutter spring 25 (shown in FIG. 3). Additionally, when considering structures of components of the enclosure 2, the shutter 22 that is a characteristic member of the present embodiment may be considered to include the rotating mechanism 23, the spring cover 24 and the shutter spring 25 in relation to the partition plate 21 that is a standard member of a storage enclosure.

The partition plate 21 is a plate-shaped member that partitions off the upper controller 4a from the lower controller 4b, and is disposed to face the inside of the enclosure from the rear surface of the enclosure, the partition plate 21 having a length that is shorter than a length of the controller 4 in the front-back direction by a depth of the shutter 22, for example. In the present embodiment, the two controllers 4 (the upper controller 4a and the lower controller 4b) are disposed inside the enclosure 2 in a manner facing each other, and thus, when the two controllers 4 are inserted in the enclosure 2, the partition plate 21 faces a top plate 41 of each of the upper controller 4a and the lower controller 4b.

Additionally, the enclosure 2 is structured such that the two controllers 4 are disposed facing each other, and thus, components related to the shutter 22 (such as the spring cover 24) may be formed into a horizontally symmetrical shape, and an increase in the size of the components may be suppressed. Furthermore, a movable space of such related components may be arranged at around a center of the upper and lower tiers, and a necessary space may be made small.

The shutter 22 is one plate-shaped member that is provided at an end portion, on a front side, of the partition plate 21, and is formed extending from the partition plate 21 via the rotating mechanism 23. Although details will be given later, the shutter 22 is to be pushed up (or pushed down) to a side of the controller 4 that is removed, and a length of the shutter 22 is such that when the shutter 22 is pushed up (or pushed down) to about a maximum level, an internal space inside the enclosure 2, that is a housing space for one controller 4, is blocked. The enclosure 2 of the present embodiment achieves, with the shutter 22 as described above, a function of blocking (or shutting off) a flow path for cooling air that passes inside the controller 4 when one of the controllers 4 on the upper and lower tiers is removed. Additionally, in the case where the controller 4 is inserted on both the upper and lower tiers, the shutter 22 is placed in a substantially horizontal state between the upper controller 4a and the lower controller 4b, but also in such a state, the shutter 22 is disposed in such a way that a front end thereof does not reach a housing area for the drives 3.

The rotating mechanism 23 is a rotating mechanism that is fixed to both the partition plate 21 and the shutter 22. The rotating mechanism 23 has a rotation shaft between the partition plate 21 and the shutter 22, and is structured to be rotatable in the up-down direction at least on the side of the shutter 22. For example, the rotating mechanism 23 is achieved by a structure where a plurality of plate-shaped members (such as sheet metals) that are rotatable around the rotation shaft are fixed to both the partition plate 21 and the shutter 22 (or the spring cover 24; see also FIGS. 3 and 4), but a general hinge or the like, for example, may also be used without being limited to the structure described above. Which structural component is to be used as the rotating mechanism 23 may be determined according to a dimension that allows components to be mounted in the enclosure 2 (or in other words, the shape and dimension of the controllers 4). In the case of using a plurality of sheet metals for the rotating mechanism 23 in the manner described above, a space is expected to be more saved than in the case of using a general hinge, and thus, a width of a center portion of the top plate of the controller 4 sandwiched between recessed portions 40 (see FIG. 5 described later) may be increased, and a greater number of components may be mounted. Additionally, in FIG. 2, one rotating mechanism 23 is provided near each spring cover 24, but the position of installation and the number of installed pieces are not limited as long as the rotating mechanism 23 is provided between the partition plate 21 and the shutter 22.

The spring cover 24 is, for example, a trapezoidal member that covers the shutter spring 25 in a non-contact manner, and is fixed to the shutter 22. The spring cover 24 has a length that is substantially the same as that of the shutter 22 in the front-back direction of the enclosure 2. The spring cover 24 is desirably formed such that, even when the shutter 22 is inclined relative to the shutter spring 25 in the manner shown in FIG. 9 described later, a space is reserved inside to such a degree that the shutter spring 25 is not contacted. Furthermore, the spring cover 24 may include a function of blocking, together with the shutter 22, a flow path of circulation inside the enclosure 2 when the shutter 22 comes into contact with a wall surface of one of the upper and lower tiers inside the enclosure 2.

Figure 4:
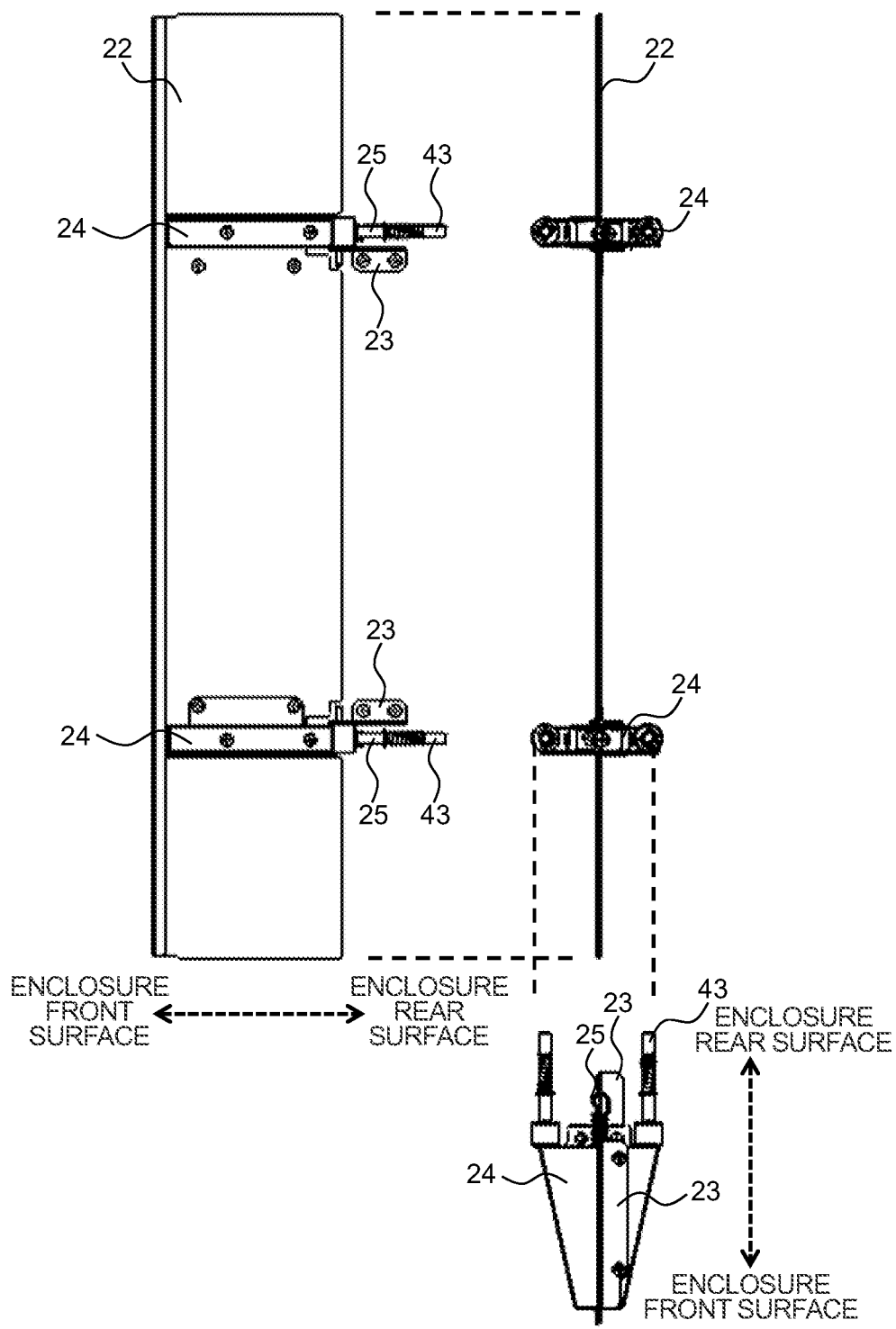
FIG. 4 is a three-view diagram of the shutter 22.

FIG. 3 is a diagram showing a detailed structure of the shutter 22. Furthermore, FIG. 4 is a three-view diagram of the shutter 22. Additionally, in FIGS. 3 and 4, a state is shown where the push rod 43 that is not fixed to the shutter 22 is in contact with the spring cover 24, to allow easy understanding of the positional relationship.

Referring to FIGS. 3 and 4, the spring cover 24 has a shape that is symmetrical on upper and lower sides of the shutter 22. Furthermore, when seen from above, the spring cover 24, the shutter spring 25, and the push rod 43 are arranged on one straight line. Moreover, the spring cover 24 is disposed at a position at which a surface thereof on the rear surface side of the enclosure is pushed by the top plate 41 and the push rod 43 when the controller 4 is being inserted (at a time of semi-insertion; that is, at a position that allows a part of the top plate 41 and an end portion of the push rod 43 to come into contact). Additionally, the rotating mechanism 23 may be disposed inside or outside the shutter spring 25.

Figure 8:
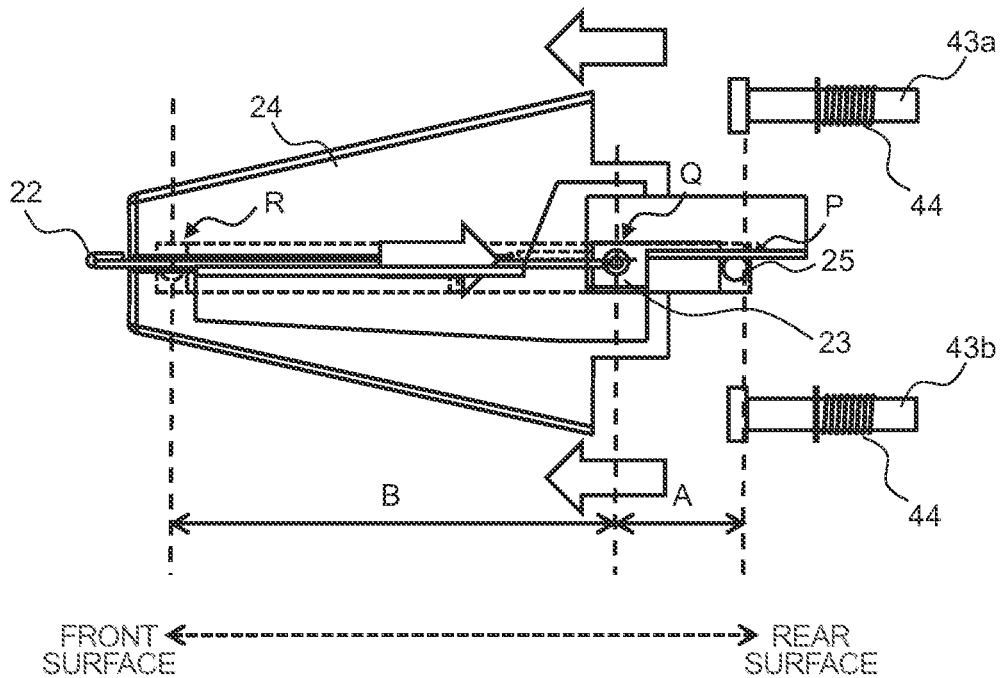
FIG. 8 is a diagram for describing operation of the shutter 22 based on contact of the push rod 43 (first diagram)
Figure 9:
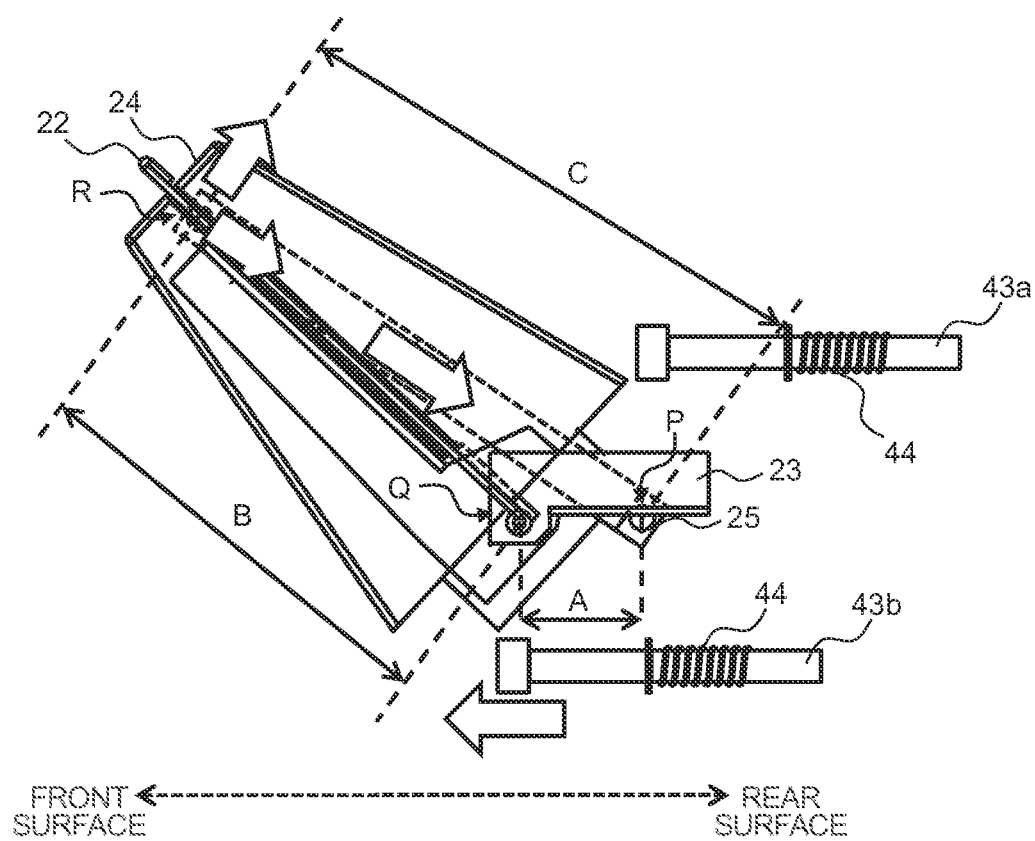
FIG. 9 is a diagram for describing the operation of the shutter 22 based on contact of the push rod 43 (second diagram)

The shutter spring 25 is a bar-shaped elastic member (such as a helical extension spring), and end portions are fixed to the partition plate 21 and the shutter 22, respectively. More specifically, a fixed position of the shutter spring 25 to the partition plate 21 (a chassis-side fixed end) is a predetermined point that is, when seen from the shutter 22, farther than the rotation shaft of the rotating mechanism 23 in a horizontal direction (that is, on the rear side). A fixed position of the shutter spring 25 to the shutter 22 (a shutter-side fixed end) is a predetermined point that is, when seen from the partition plate 21, farther than the rotation shaft of the rotating mechanism 23 in the horizontal direction (that is, on the front side). In FIGS. 8 and 9 described later, the chassis-side fixed end is indicated by a point P, the rotation shaft of the rotating mechanism 23 by a point Q, and the shutter-side fixed end by a point R.

Furthermore, in the present embodiment, the shutter spring 25 is fixed to the partition plate 21 and the shutter 22 in a state where the shutter spring 25 is longer (extended) than a natural length. Accordingly, a tensile force to contract is applied to the shutter spring 25 on a constant basis. When the shutter 22 is slightly rotated by insertion/removal of the controller 4, an angle is formed between a vector of the tensile force of the shutter spring 25 and the shutter 22, and a rotational moment is generated at the shutter 22 due to a force component of the tensile force of the shutter spring 25, and the shutter 22 may be made to incline upward or downward by being more greatly rotated.

FIG. 5 is a perspective view of an external appearance of the controller 4. As shown in FIG. 5, the controller 4 includes, at a top surface, the top plate 41 where a step is formed, and includes, at a bottom surface, a planar bottom plate (not shown). The top plate 41 is formed such that a front end portion thereof pushes the spring cover 24 at the time of insertion of the controller 4 into the enclosure 2.

Depressions (the recessed portions 40) are formed on the controller 4 by cutting out parts of an upper side of an insertion surface (on the side of the partition plate 21 and on the front surface side of the enclosure), and the push rod 43, a push rod spring 44, and spring receiving members 45 (see FIGS. 6 and 7) are disposed in each recessed portion 40. By forming such a recessed portion 40, a movable range may be reserved for the push rod 43 described later. Furthermore, as described above, the controller 4 includes the fan 42 for cooling that is built therein, and when the fan 42 operates, cooling air flows inside the controller 4 surrounded by the top plate and the bottom plate, in the front-back direction.

The push rod 43 is a bar-shaped member that is capable of moving in the front-back direction inside the recessed portion 40 according to insertion/removal of the controller 4 from the enclosure 2, and the push rod spring 44 that is an elastic member (for example, a helical compression spring) is wound around the push rod 43. An end of the push rod spring 44 on the front side is fixed to the push rod 43, and the other end on the rear side is supported by the spring receiving member 45 (see FIGS. 6 and 7). The push rod 43 and the push rod spring 44 are installed in a pair.

Figure 6:
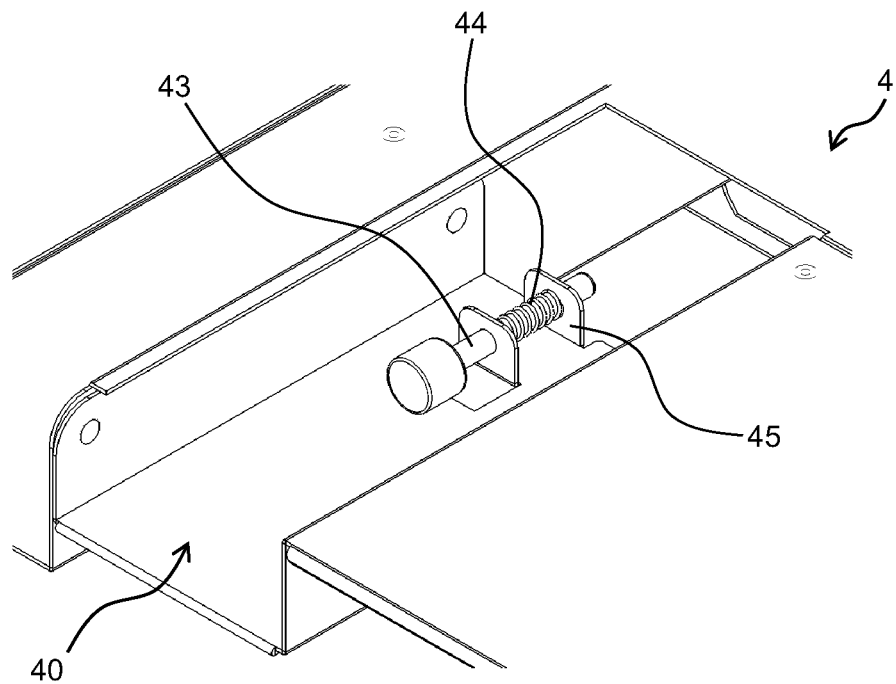
FIG. 6 is an enlarged view of a push rod 43 and its periphery in a state where a push rod spring 44 is not compressed.
Figure 7:
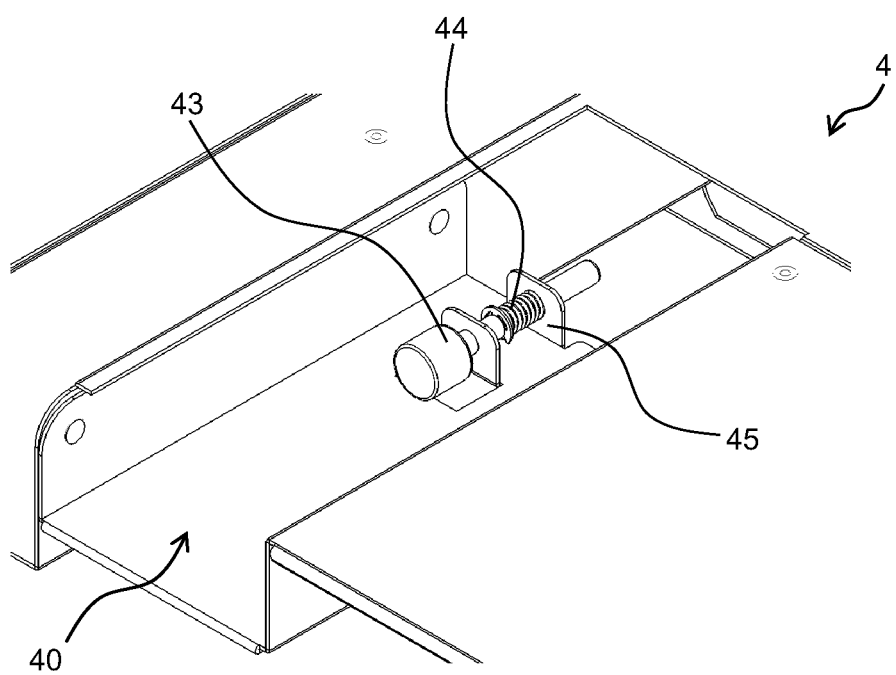
FIG. 7 is an enlarged view of the push rod 43 and its periphery in a state where the push rod spring 44 is compressed.

FIG. 6 is an enlarged view of the push rod 43 and its periphery in a state where the push rod spring 44 is not compressed, and FIG. 7 is an enlarged view of the push rod 43 and its periphery in a state where the push rod spring 44 is compressed.

As shown in FIG. 6, when the controller 4 is not disposed in the enclosure 2, the push rod spring 44 is in a natural length state without being compressed. Alternatively, in the case where a gap between front and rear spring receiving members 45 that are fixed to the controller 4 in a manner sandwiching the push rod spring 44 is smaller than the natural length of the push rod spring 44, the push rod spring 44 is received between end portions of the front and rear spring receiving members 45. In these states, the push rod 43 does not receive force from the push rod spring 44.

On the other hand, when the push rod 43 comes into contact with the spring cover 24 while the controller 4 is being inserted into the enclosure 2, the push rod spring 44 is compressed and an elastic force of pushing the push rod 43 forward is generated, as shown in FIG. 7.

Additionally, in FIGS. 6 and 7, the push rod 43 and the push rod spring 44 are provided on the controller 4, but in the present embodiment, the push rod 43 and the push rod spring 44 may alternatively be provided on the enclosure 2 (for example, on the partition plate 21). However, also in the case of being provided on the enclosure 2, as in the case of being provided on the controller 4, the push rod 43 has to be slidable in an insertion/removable direction of the controller 4, and the push rod 43 has to be disposed at a position where the push rod 43 comes into contact with the spring cover 24 while the controller 4 is being inserted/removed from the enclosure 2, and in the case where insertion of the controller 4 is to be continued in a state where the push rod 43 is in contact with the spring cover 24, an elastic force for pushing the push rod 43 toward the spring cover 24 has to be generated by compression of the push rod spring 44.

FIGS. 8 and 9 are diagrams for describing operation of the shutter 22 based on contact of the push rod 43 (first and second diagrams). FIG. 8 is a diagram showing the state of the shutter 22 when the upper controller 4a and the lower controller 4b are mounted on the upper and lower tiers in the enclosure 2, and FIG. 9 is a diagram showing the state of the shutter 22 when the upper controller 4a is removed from the upper tier in the enclosure 2. A push rod 43a shown in FIGS. 8 and 9 is the push rod 43 for the upper controller 4a, and a push rod 43b is the push rod 43 for the lower controller 4b.

In FIGS. 8 and 9, the point P indicates the chassis-side fixed end of the shutter spring 25, the point Q indicates the rotation shaft of the rotating mechanism 23, and the point R indicates the shutter-side fixed end of the shutter spring 25. A distance A is the distance between the point P and the point Q, and a distance B is the distance between the point Q and the point R. The partition plate 21 where the point P is present and the shutter 22 where the point R is present are members that do not expand/contract and are both fixed to the rotating mechanism 23, and thus, it can be seen that the distances A, B take values that are fixed on a constant basis. Furthermore, a distance C shown in FIG. 9 is the distance between the point P and the point R, and may be said to be the length of the shutter spring 25. The distance C will be described later.

First, the state in FIG. 8 will be described.

In the case of a semi-inserted state where the controller 4 is being inserted into the enclosure 2, the push rod 43 for the controller 4 comes into contact with the spring cover 24, and compresses the push rod spring 44 as insertion proceeds. Accordingly, in an inserted state where the controller 4 is completely inserted in the enclosure 2, an elastic force of pushing the push rod 43 forward is generated by the push rod spring 44. That is, when the controllers 4 reach the inserted state on the upper and lower tiers, a forward-pushing force is generated on both the push rods 43a and 43b.

For its part, the shutter spring 25 is fixed to the partition plate 21 and the shutter 22 in a state where the shutter spring 25 is longer (extended) than the natural length. Accordingly, a tensile force to contract is applied to the shutter spring 25 (and therefore, the spring cover 24) on a constant basis.

As a result, as shown in FIG. 8, because forces of the push rods 43a, 43b, attached to the upper and lower controllers 4a, 4b, pushing the spring covers 24 (left arrows in FIG. 8) are balanced between upper and lower sides and a force in the up-down direction is hardly applied to the shutter 22, and moreover, a contracting force by the shutter spring 25 (a right arrow in FIG. 8) is applied, the shutter 22 is made parallel to the two controllers 4a, 4b. In such a parallel state, a flow path of cooling air passing through each controller 4a, 4b by operation of the fan 42 is not obstructed by the shutter 22.

Next, the state in FIG. 9 will be described.

When the upper controller 4a is being removed from the enclosure 2, a force of the push rod spring 44 pushing the push rod 43a is gradually reduced, and when the push rod spring 44 is returned to the natural length (or returned to the length between the front and rear spring receiving members 45), a force of pushing the push rod 43a toward the front surface is no longer generated. However, the lower controller 4b is mounted in the enclosure 2, and the push rod 43b keeps pushing the spring cover 24. As a result, the forces from the upper and lower push rods 43a, 43b become unbalanced, and the spring cover 24 (that is, the shutter 22) slightly rotates clockwise around the rotation shaft of the rotating mechanism 23.

Here, when taking the shutter-side fixed end (the point R) of the shutter spring 25 as a reference, the chassis-side fixed end (the point P) of the shutter spring 25 is at a position farther than the rotation shaft (the point Q), and when the shutter 22 is even slightly rotated as in the manner described above, an angle is formed between the vector of the tensile force of the shutter spring 25 and the shutter 22, and a force component in a direction of further rotation (in the case of FIG. 9, a clockwise direction) is generated. As a result, a rotational moment is generated, and the shutter 22 is caused by the shutter spring 25 to continue the rotation operation even after exceeding a push stroke of the push rod 43b.

A series of rotation operations of the shutter 22 described above will be described using the distances A, B, C. In FIG. 8, because the shutter 22 is in the parallel state and the points P, Q, R are on a straight line, the length of the shutter spring 25 is "A+B". However, in FIG. 9, because the shutter 22 is slightly rotated, the points P, Q, R form a triangle, and the distance C indicating the length of the shutter spring 25 reaches a relationship "C<A+B" and is made smaller than in FIG. 8. Moreover, a tensile force from the point R toward the point P is generated at the shutter spring 25, and thus, a force is applied to reduce the length of the shutter spring 25 (the distance C). As a result, a rotational moment is generated at the shutter 22 to which the shutter spring 25 is coupled, and the shutter 22 keeps greatly rotating.

As described above, in the case of FIG. 9, the shutter 22 greatly rotates in a direction of the removed controller 4a due to the tensile force of the shutter spring 25, and in the end, stops at a position of covering the housing space for the controller 4a in the enclosure 2.

Figure 10:
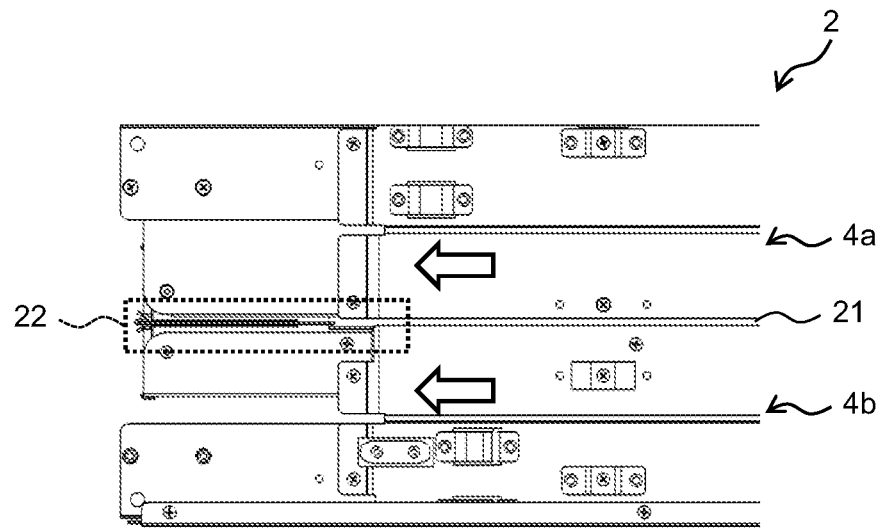
FIG. 10 is a diagram for describing a transition in the operation of the shutter 22 (first diagram)
Figure 11:
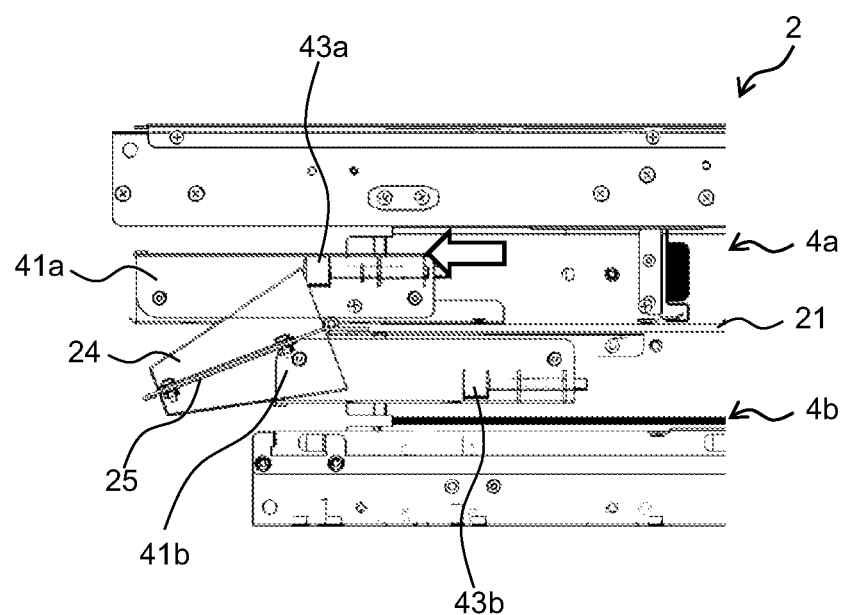
FIG. 11 is a diagram for describing the transition in the operation of the shutter 22 (second diagram)
Figure 12:
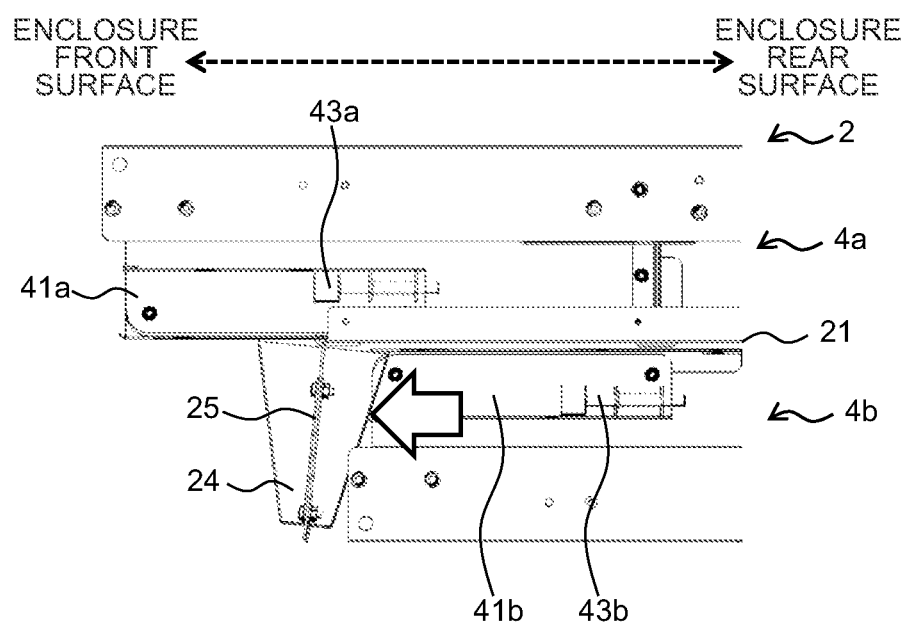
FIG. 12 is a diagram for describing the transition in the operation of the shutter 22 (third diagram).

FIGS. 10 to 12 are diagrams for describing a transition in the operation of the shutter 22 (first to third diagrams). In FIGS. 8 and 9, an operation of the shutter 22 based on contact of the push rod 43 with the spring cover 24 is described, but in FIGS. 10 to 12, a transition in the operation of the shutter 22 when the lower controller 4b is removed from a state where the controllers 4 (the upper controller 4a and the lower controller 4b) are inserted in the upper and lower tiers in the enclosure 2 is described as an example of overall operation of the shutter 22 based on insertion/removal of the controller 4.

First, in the state where the controllers 4 (the upper controller 4a and the lower controller 4b) are inserted in the upper and lower tiers in the enclosure 2, the spring cover 24 is pushed by the push rod 43a on the upper side and the push rod 43b on the lower side, as described with reference to FIG. 8. Accordingly, at this time, the shutter 22 to which the spring cover 24 is coupled is parallel to the two controllers 4, as shown in FIG. 10.

Next, as described with reference to FIG. 9 (FIG. 9 describes a case where the upper controller 4a is removed, and thus, in the present example, a vertically reversed case is considered), when removal of the lower controller 4b is started, the spring cover 24 stays in the state of being pushed by the push rod 43a on the upper side, but a pushing force from the push rod 43b on the lower side is lost (is gradually reduced), and thus, forces become unbalanced between the upper and lower tiers. Accordingly, the shutter 22 to which the spring cover 24 is coupled slightly rotates counterclockwise (downward) around the rotation shaft of the rotating mechanism 23.

At this time, as described with reference to FIG. 9, a rotational moment is generated due to a force component of the tensile force of the shutter spring 25, and the shutter 22 continues the rotation operation even after exceeding a push stroke of the push rod 43a. Accordingly, as shown in FIG. 11, even when the push rod 43b on the lower side is no longer in contact with the spring cover 24 due to removal of the lower controller 4b, the shutter 22 rotates further downward.

Then, when the lower controller 4b is further removed to a position where a top plate 41b of the lower controller 4b is no longer in contact with the spring cover 24, the shutter 22 reaches a bottom surface of the housing space, in the enclosure 2, for the lower controller 4b. That is, as shown in FIG. 12, the shutter 22 is pushed down to a position of blocking the lower tier of the enclosure 2. When the shutter 22 is lowered to such a position, circulation is not caused in the lower tier in the enclosure 2 even when the fan 42 of the upper controller 4a is operated, and thus, a reduction in the amount of air taken in from the drives 3 can be prevented, and reduction in cooling performance for the drives 3 can be prevented.

In the case where one of the controllers (for example, the lower controller 4b) is inserted into the enclosure 2 in a state where the other controller (for example, the upper controller 4a) is inserted, the transition is the reverse of that shown in FIGS. 10 to 12 described above.

Specifically, first, when insertion of the lower controller 4b on the lower tier in the enclosure 2 is started, the top plate 41b of the lower controller 4b comes into contact with the spring cover 24, and the spring cover 24 is pushed up as the lower controller 4b is inserted. As a result, in a mode where the state in FIG. 12 transitions to the state in FIG. 11, the shutter 22 that is coupled to the spring cover 24 is gradually pushed upward from a state of being lowered at a position of blocking the lower tier in the enclosure 2. An arrow shown in FIG. 12 indicates a force of the top plate 41b pushing the shutter 22.

Then, when the lower controller 4b is further inserted, the push rod 43b on the lower side comes into contact with the spring cover 24, and the push rod 43b pushes the spring cover 24 toward the front surface. As the insertion proceeds, the push rod spring 44 contracts, and an elastic force of the push rod 43b pushing the spring cover 24 toward the front surface is increased.

Then, in the end, when insertion of the lower controller 4b is completed, the spring cover 24 is pushed by the push rod 43a on the upper side and the push rod 43b on the lower side with approximately same forces, and the shutter 22 is made parallel to the two controllers 4, as shown in FIG. 10.

As described above, the enclosure 2 according to the present embodiment is a storage enclosure where the controllers 4 may be mounted, one each on the upper and lower tiers inside the enclosure, and in the case where the controllers 4 are inserted on the upper and lower tiers, the spring cover 24 that is fixed to one shutter 22 that is provided extending from an intermediate member (the partition plate 21) between the upper and lower tiers via the rotating mechanism 23 is pushed toward the front surface by the push rods 43a, 43b for the two controllers 4, on the upper and lower tiers, and the shutter 22 may thereby be stabilized while being parallel to the two controllers 4. Furthermore, at this time, a force of pushing toward the rear surface side is also applied to the shutter 22 by a tensile force that is generated at the shutter spring 25 on a constant basis, and thus, the parallel state may be more stably maintained. In the case where one of the controllers 4 on the upper and lower tiers in the enclosure 2 is removed, one shutter 22 is pushed up (or down) toward the tier from which the controller 4 is removed, and thus, a flow path for cooling air in the space inside the enclosure 2 formed by removal of the controller 4 may be blocked (or shut off). At this time, immediately after removal is started, forces of the push rods 43a, 43b on the upper and lower tiers for pushing the spring cover 24 toward the front surface become unbalanced, and the shutter 22 starts the operation of rotating to the removal side, and moreover, an angle is formed between the shutter 22 and the shutter spring 25 due to such operation and a force component in a perpendicular direction is generated in relation to the elastic force of the shutter spring 25, and the operation of the shutter 22 is enforced by the force component, allowing the shutter 22 to more greatly rotate toward the side of the housing space for the controller 4. Accordingly, with the enclosure 2 according to the present embodiment, occurrence of circulation at the time of removal of one controller 4 at the time of maintenance or the like can be prevented, and the cooling performance for the drives 3 can be prevented from being reduced. Furthermore, with the enclosure 2 according to the present embodiment, the above-described effects may be obtained by one shutter 22, without needing a plurality of shutters, and thus, the size of the enclosure 2 and the housing space inside the enclosure 2 can be prevented from being restricted.

REFERENCE SIGNS LIST 1 storage unit
2 storage enclosure (enclosure)
3 drive
4 electronic computing module (controller board)
4a upper controller
4b lower controller
21 partition plate
22 shutter
23 rotating mechanism
24 spring cover
25 shutter spring
40 recessed portion
41 (41a, 41b) top plate
42 fan
43 (43a, 43b) push rod
44 push rod spring
45 spring receiving member

What is claimed is:

1. An enclosure for an electronic computing apparatus that allows mounting of a storage apparatus and two electronic computing modules, the two electronic computing modules each having a built-in fan and being disposed on a rear surface side of the storage apparatus in a perpendicular direction relative to a bottom surface of the enclosure, the enclosure comprising:
- a partition plate that separates housing spaces for mounting the two electronic computing modules;
- one shutter that is a plate-shaped member for adjusting a flow path, in the housing spaces, of cooling air generated by operation of the built-in fans, the one shutter being disposed extending from the partition plate, on the rear surface side of the storage apparatus;
- at least one rotating mechanism that couples the partition plate and the one shutter, and that is rotatable around a rotation shaft of the at least one rotating mechanism;
- a push rod that is a bar-shaped member disposed between a cover fixed to the one shutter and each of the two electronic computing modules, the push rod being moved, at a time of insertion of a corresponding electronic computing module of the two electronic computing modules, in an insertion direction by being pushed by the corresponding electronic computing module to come into contact with the cover; and a push rod spring that is an elastic member wound around the push rod, the push rod spring applying an elastic force of pushing in a front surface direction to the push rod by being compressed by movement of the push rod in the insertion direction, wherein in a case where the two electronic computing modules are inserted in the housing spaces, the one shutter is at an intermediate position between the two electronic computing modules due to the elastic force of pushing the cover in the front surface direction from the push rod corresponding to each of the two electronic computing modules, and in a case where one of the two electronic computing modules is removed from the housing spaces, the elastic force of pushing the cover in the front surface direction from the push rod corresponding to a removed electronic computing module is lost, and the one shutter then moves, around the at least one rotating mechanism, to a side of the housing spaces for the removed electronic computing module and shuts off the flow path in the housing spaces.

2. The enclosure for the electronic computing apparatus according to claim 1, further comprising a shutter spring that is an elastic member having end portions fixed to the partition plate and the one shutter in a state where the shutter spring is longer than a natural length, the shutter spring generating the elastic force in a rear surface direction on a constant basis, wherein the cover is a spring cover fixed to the one shutter so as to cover the shutter spring in a non-contact manner, and in a case where one of the two electronic computing modules is removed from the housing spaces, a force component in a perpendicular direction is generated in relation to the elastic force of the shutter spring due to an angle being formed between the one shutter and the shutter spring by operation of the one shutter, and the force component enforces the operation of the one shutter.

3. The enclosure for the electronic computing apparatus according to claim 1, wherein the cover is structured to come into contact with a top plate of each of the two electronic computing modules at the time of insertion of the corresponding electronic computing module, before coming into contact with the push rod, and to receive, from the top plate, a force of pushing in a perpendicular direction as insertion proceeds.

4. The enclosure for the electronic computing apparatus according to claim 1, wherein the at least one rotating mechanism is structured to include a plurality of plate-shaped members that rotate around the rotation shaft, the plurality of plate-shaped members being fixed to the partition plate and the one shutter.

5. The enclosure for the electronic computing apparatus according to claim 1, wherein the housing spaces separated by the partition plate are formed such that the two electronic computing modules are disposed facing each other.

6. An electronic computing apparatus comprising:
a storage apparatus;
two electronic computing modules each having a built-in fan; and
an enclosure, the enclosure housing the storage apparatus on a front surface side, the enclosure housing the two electronic computing modules on a rear surface side of the storage apparatus in a perpendicular direction relative to a bottom surface of the enclosure, wherein
the enclosure includes a partition plate that separates housing spaces for mounting the two electronic computing modules, one shutter that is a plate-shaped member for adjusting a flow path, in the housing spaces, of cooling air generated by operation of the built-in fans, the one shutter being disposed extending from the partition plate, on the rear surface side of the storage apparatus, and at least one rotating mechanism that couples the partition plate and the one shutter, and that is rotatable around a rotation shaft of the at least one rotating mechanism, the two electronic computing modules each include a push rod that is a bar-shaped member disposed on a front surface side of each of the two electronic computing modules, the push rod being moved, at a time of insertion of a corresponding electronic computing module of the two electronic computing modules, in an insertion direction by being pushed by the corresponding electronic computing module to come into contact with a cover fixed to the one shutter, and a push rod spring that is an elastic member wound around the push rod, the push rod spring applying an elastic force of pushing in a front surface direction to the push rod by being compressed by movement of the push rod in the insertion direction, in a case where the two electronic computing modules are inserted in the housing spaces, the one shutter is at an intermediate position between the two electronic computing modules due to the elastic force of pushing the cover in the front surface direction from the push rod corresponding to each of the two electronic computing modules, and in a case where one of the two electronic computing modules is removed from the housing spaces, the elastic force of pushing the cover in the front surface direction from the push rod corresponding to a removed electronic computing module is lost, and the one shutter then moves, around the at least one rotating mechanism, to a side of the housing spaces for the removed electronic computing module and shuts off the flow path in the housing spaces.

7. The electronic computing apparatus according to claim 6, wherein the enclosure further includes a shutter spring that is an elastic member having end portions fixed to the partition plate and the one shutter in a state where the shutter spring is longer than a natural length, the shutter spring generating the elastic force in a rear surface direction on a constant basis, the cover is a spring cover fixed to the one shutter so as to cover the shutter spring in a non-contact manner, and in a case where one of the two electronic computing modules is removed from the housing spaces, a force component in a perpendicular direction is generated in relation to the elastic force of the shutter spring due to an angle being formed between the one shutter and the shutter spring by operation of the one shutter, and the force component enforces the operation of the one shutter.

8. The electronic computing apparatus according to claim 6, wherein the cover is structured to come into contact with a top plate of each of the two electronic computing modules at the time of insertion of the corresponding electronic computing module, before coming into contact with the push rod, and to receive, from the top plate, a force of pushing in a perpendicular direction as insertion proceeds.

9. The electronic computing apparatus according to claim 6, wherein the at least one rotating mechanism is structured to include a plurality of plate-shaped members that rotate around the rotation shaft, the plurality of plate-shaped members being fixed to the partition plate and the one shutter.

10. The electronic computing apparatus according to claim 6, wherein, in the enclosure, the two electronic computing modules are disposed, facing each other, in the housing spaces separated by the partition plate.

11. The electronic computing apparatus according to claim 6, wherein the two electronic computing modules each include
- a recessed portion formed by cutting out a part of an insertion surface to the enclosure, and
- the push rod and the push rod spring being disposed in the recessed portion.

\* \* \* \* \*